(12) United States Patent
Kobayashi et al.

(10) Patent No.: US 9,048,829 B2
(45) Date of Patent: Jun. 2, 2015

(54) POWER SEMICONDUCTOR DEVICE DRIVING CIRCUIT (71) Applicant: DENSO CORPORATION, Kariya, Aichi-pref. (JP)

(72) Inventors: Atsushi Kobayashi, Kariya (JP); Hisashi Takasu, Nishio (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/259,326

(22) Filed: Apr. 23, 2014

(65) Prior Publication Data
US 2014/0232436 A1  Aug. 21, 2014

Related U.S. Application Data (62) Division of application No. 13/616,158, filed on Sep. 14, 2012, now abandoned.

(30) Foreign Application Priority Data

Nov. 18, 2011  (JP) .................................. 2011-252884

(51) Int. Cl.
H03K 17/08 (2006.01)
H03K 17/082 (2006.01)

(52) U.S. Cl.
CPC ............ *H03K 17/0822* (2013.01); *H03K 17/08* (2013.01); *H03K 2217/0027* (2013.01); *H03K 2217/0045* (2013.01)

(58) Field of Classification Search
CPC .................. H03K 17/0822; H03K 2217/0027; H03K 2217/0045; H03K 17/08
See application file for complete search history.

(56) References Cited

U.S. PATENT DOCUMENTS

| 6,385,028 | B1 | 5/2002 | Kouno |
| 6,614,633 | B1 | 9/2003 | Kohno |
| 2007/0222485 | A1 | 9/2007 | Ueda |
| 2012/0250205 | A1 | 10/2012 | Pfitzer et al. |

FOREIGN PATENT DOCUMENTS

| CN | 101119605 A | 2/2008 |
| JP | 2006-120567 A | 5/2006 |
| JP | 2009-131035 A | 6/2009 |

OTHER PUBLICATIONS

Office Action issued from the Japanese Patent Office mailed Oct. 29, 2013 in the corresponding Japanese application No. 2011-252884 (with English translation).
Office Action dated Dec. 18, 2014 in the corresponding CN application No. 201210465122.9 (and English translation).

*Primary Examiner* — Lincoln Donovan
*Assistant Examiner* — Jung Kim
(74) *Attorney, Agent, or Firm* — Posz Law Group, PLC (57) ABSTRACT A power semiconductor device driving circuit includes a gate control terminal, which is provided at a position separated from a drain terminal of a power semiconductor device by a predetermined distance so that electric discharge is generated between the drain terminal and the gate control terminal at the time of generation of surge. A surge voltage is applied to the gate control terminal due to this discharge, the gate of the power semiconductor device is charged to turn on and absorb the surge energy. Thus it becomes possible to suppress the surge voltage applied to the drain terminal and prevent breakdown of the power semiconductor device.

7 Claims, 10 Drawing Sheets

POWER SEMICONDUCTOR DEVICE DRIVING CIRCUIT

CROSS REFERENCE TO RELATED APPLICATIONS

The present application is a divisional of U.S. application Ser. No. 13/616,158 filed on Sep. 14, 2012, which is based on and incorporates herein by reference Japanese patent application No. 2011-252884 filed on Nov. 18, 2011.

TECHNICAL FIELD

The present disclosure relates to a power semiconductor device driving circuit for driving a power semiconductor device (semiconductor switching device), which switches over supply of current to a load.

BACKGROUND

In a power semiconductor device, a surge voltage (overvoltage) greater than a withstand voltage is generated between a drain and a source, that is, in a drain-source path, of the power semiconductor device due to an inductive (L) load and noise, when it is turned off in the switching operation. This surge voltage sometimes causes breakdown of the power semiconductor device. A conventional power semiconductor device is generally made of silicon (Si) and a withstand voltage of such a power semiconductor device is limited by a limited characteristic or performance of Si material itself. As an alternative, a wide gap semiconductor device exemplified by gallium nitride (GaN) is considered. The GaN semiconductor device is promising as a power semiconductor device, which has a low on-resistance and a high withstand voltage.

Although the conventional Si semiconductor device (for example, MOSFET and IGBT) is configured to withstand surge voltages, the GaN semiconductor device itself is not configured so and hence has no surge voltage withstand property. It is therefore necessary to provide an external circuit to ensure the surge voltage withstand property, which is required to be used for vehicles.

Figure 11:
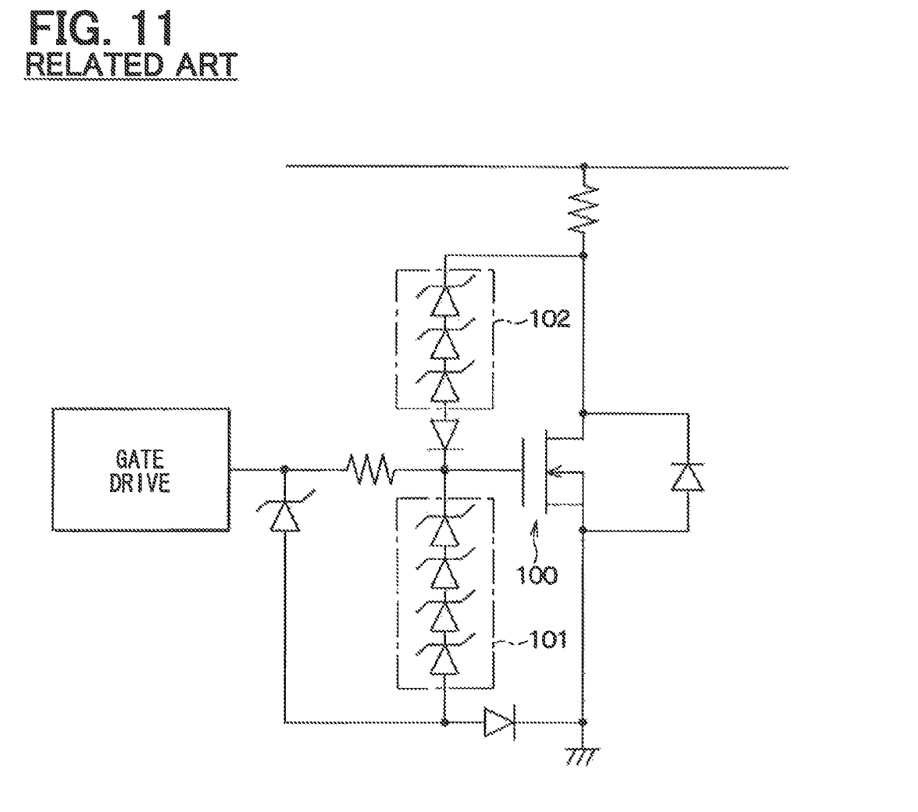
FIG. 11 is a circuit diagram showing a conventional power semiconductor device driving circuit.

JP 2000-077537A (patent document), which corresponds to U.S. Pat. No. 6,385,028, discloses a power semiconductor device, which improves surge voltage withstand property. FIG. 11 shows an exemplary power semiconductor device driving circuit. As shown in the figure, Zener diodes 102 are arranged for voltage clamping between a drain and a gate of a power semiconductor device 100 in addition to Zener diodes 101 arranged for gate protection between the gate and a source of the power semiconductor device 100. When a surge voltage is applied to the drain, the Zener diodes 102 break down and absorb the surge.

According to the driving circuit disclosed in the patent document, when the surge voltage in a drain-source path exceeds the Zener voltage at the time of turn-off of the power semiconductor device 100, its drain-gate path conducts and a gate voltage is raised. Thus the surge voltage is controlled to a sum of the Zener voltage and a threshold voltage of the power semiconductor device.

However, since a rated voltage of the Zener diode increases in a high power system, the driving circuit becomes large and costs high.

The GaN semiconductor device described above has a small capacitance and hence is more susceptible to parasitic capacitance than the conventional semiconductor device. For this reason, if a parasitic capacitance is added to the gate, it will lower high speed switching performance characteristic.

SUMMARY

It is therefore an object to provide a power semiconductor device driving circuit, which can increase a surge withstand voltage of a power semiconductor device and protect the power semiconductor device from overvoltage.

According to one aspect, a power semiconductor device driving circuit is provided with a power semiconductor device, a gate driving circuit, a discharge terminal and a gate charge circuit. The power semiconductor device is formed of a semiconductor switching device, which controls a current supplied to a first terminal and a second terminal based on a gate voltage applied to a gate terminal. The first terminal and the second terminal are a high-side terminal and a low-side terminal. The gate driving circuit controls the gate voltage applied to the gate terminal of the power semiconductor device. The discharge terminal is provided at a position separated from the first terminal by a predetermined distance to cause a discharge between the first terminal when the voltage at the first terminal rises by generation of surge and reaches a dielectric breakdown voltage. The gate charge circuit turns on the power semiconductor device by charging a gate of the power semiconductor device based on the discharge between the first terminal and the discharge terminal and lowers the voltage of the first terminal by a current flowing between the first terminal and the second terminal.

BRIEF DESCRIPTION OF THE DRAWINGS

The above and other objects, features and advantages will become more apparent from the following detailed description made with reference to the accompanying drawings. In the drawings.

EMBODIMENT

A power semiconductor device driving circuit will be described in detail below with reference to various embodiments shown in the drawings, in which same or similar parts are designated by same reference numerals.

First Embodiment

Figure 1:
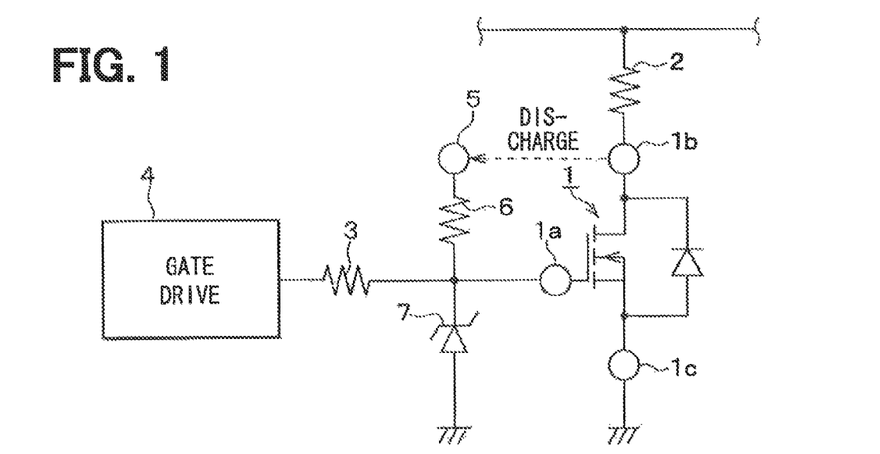
FIG. 1 is a circuit diagram showing a first embodiment of a power semiconductor device driving circuit.

A first embodiment of a power semiconductor device driving circuit is configured as shown in FIG. 1. A voltage at a control terminal 1a of a power semiconductor device 1 formed of a semiconductor switching device is controlled to control a current, which flows between a first terminal 1b and a second terminal 1c. The first terminal 1b and the second terminal 1c are a high-side terminal and a low-side terminal of the power semiconductor device 1, respectively. Thus a current supplied to a load 2 connected to the first terminal 1b of the power semiconductor device 1 is controlled. Although the load 2 is exemplified as being connected to the first terminal 1b of the power semiconductor device 1, that is, a high potential side, it may be connected to the second terminal 1c, that is, a low potential side. Although the power semiconductor device 1 is exemplified as a MOSFET. In case that the power semiconductor device 1 is the MOSFET, the control terminal 1a, the first terminal 1b and the second terminal 1c are a gate terminal, a drain terminal and a source terminal, respectively. The control terminal 1a, the first terminal 1b and the second terminal 1c are referred to as a gate terminal, a drain terminal and a source terminal, respectively.

A voltage (gate terminal voltage) of the gate terminal 1a of the power semiconductor device 1 is controlled by a gate driving circuit 4 through a gate resistor 3. By controlling the gate terminal voltage, the power semiconductor device 1 is turned on and off. The gate driving circuit 4 is configured to control the gate terminal voltage based on a gate signal applied from, for example, an external control unit.

A gate control terminal 5 is provided separately from the gate terminal 1a as a discharge terminal at a position spaced apart from the drain terminal 1b by a predetermined distance. The drain terminal 1b and the gate control terminal 5 are configured to face each other and are electrically insulated by providing, for example, a vacuumed condition or an air/gas-filled condition. In a case that the space between the drain terminal 1b and the gate control terminal 5 is vacuumed or filled with predetermined gas, entirety of the power semiconductor device driving circuit 1 or at least a space between the drain terminal 1b and the gate control terminal 5 is sealed gas-tightly by a case, and the inside of the case is vacuumed or filled with the predetermined gas.

The gate control terminal 5 is connected electrically only to a resistor 6. The resistor 6 is provided to form a gate charging circuit between the gate control terminal 5 and a connection wire between the gate resistor 3 and the gate terminal 1a, that is, between the gate control terminal 5 and the gate terminal 1a. Further, a Zener diode 7 is provided between the gate terminal 1a and a reference potential point, that is, a GND potential point which is the same potential as the source terminal 1c. The Zener diode 7 limits a gate-source voltage not t exceed the Zener voltage.

In the power semiconductor device driving circuit 1, the resistor 6 and the Zener diode 7 may be connected externally, and the gate resistor 3 and the gate driving circuit 4 may be provided in one integrated circuit (IC). Alternatively, all the parts may be provided in one integrated circuit or provided externally as the case may be.

Figure 2:
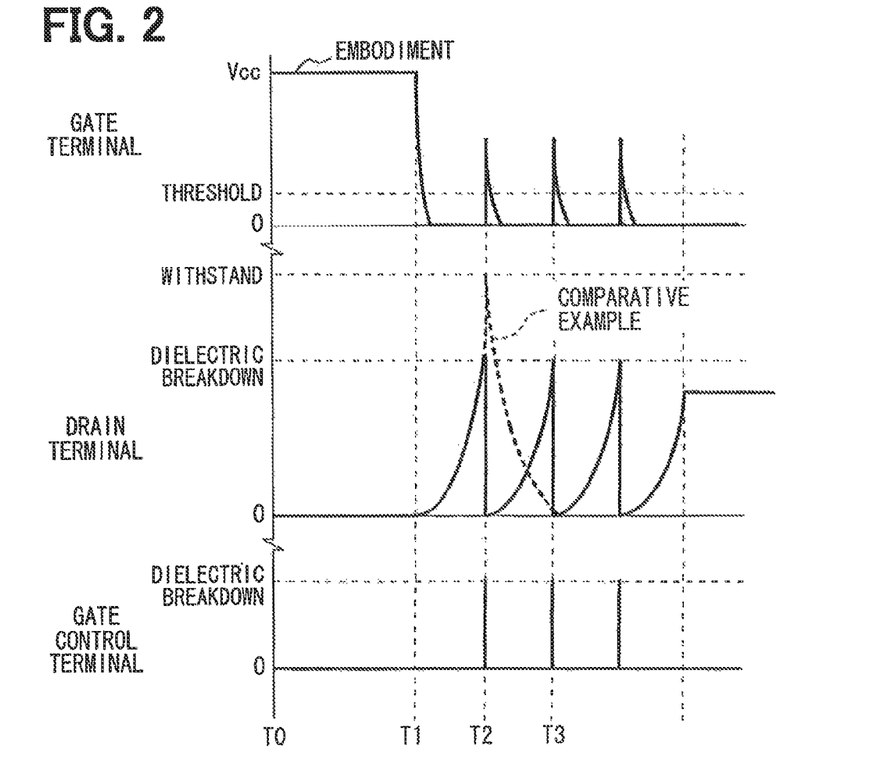
FIG. 2 is a time chart showing a basic operation of the first embodiment when a power semiconductor device is turned off.

An operation of the first embodiment will be described next with reference to FIG. 2, which is a time chart showing a basic operation of the driving circuit at the time of turn-off of the semiconductor power device 1. Since an operation at the time of turn-on of the semiconductor power device 1 is the same as in the conventional circuit, only the basic operation at the time of turn-off is described.

At time T0, the gate terminal voltage Vg is maintained to be equal to or higher than a threshold voltage Vth by the gate driving circuit 4 and the power semiconductor device 1 is maintained in an on-state. When the gate terminal voltage is then changed to 0 at time T1 the power semiconductor device 1 is turned off.

At this turn-off time, a surge voltage is applied to a drain-source path of the power semiconductor device 1 due to an inductive load and noise. If no countermeasure is taken, the drain terminal voltage Vd becomes higher than a power source voltage Vcc and the surge voltage further rises above a dielectric breakdown voltage Vdb as indicated by a dotted line in FIG. 2 as a comparative example. When the surge voltage rises above a withstand voltage Vw of the power semiconductor device 1, the power semiconductor device 1 beaks down.

According to the first embodiment, as described above, the gate control terminal 5 is arranged at the position spaced apart from the drain terminal 1b by the predetermined distance. Further the drain terminal 1b and the gate control terminal 5 are electrically insulated. If the voltage between the drain terminal 1b and the gate control terminal 5 reaches the dielectric breakdown voltage, electric discharge occurs and a surge voltage is applied to the gate control terminal 5. This surge voltage is applied to the gate of the power semiconductor device 1 through the resistor 6 to charge the gate. The power semiconductor device 1 thus temporarily turns on at time T2 and the drain terminal voltage decreases. At this time, energy of the surge voltage (surge energy) is consumed by the on-resistance of the power semiconductor device 1.

When the gate voltage of the power semiconductor device 1 falls below the threshold voltage due to absorption of the surge energy, the drain terminal voltage rises again. When the voltage between the drain terminal 1b and the gate control terminal 5 reaches the dielectric breakdown voltage at time T3, the discharge arises again so that the voltage is developed at the gate control terminal 5. This voltage charges the gate of the power semiconductor device 1 through the resistor 6. The above-described operation is repeated until the surge energy disappear. The surge voltage applied to the drain terminal 1b is thus suppressed.

The dielectric breakdown voltage Vdb [kV] is defined by the following equation according to Paschen's law. In the following equation, 3 is a constant [kV] corresponding to atmospheric air. This constant varies when the space between the drain terminal 1b and the gate control terminal 5 is vacuumed or filled with predetermined gas. The inter-terminal distance indicates a distance [mm] of a discharge path between the drain terminal 1b and the gate control terminal 5.

$$Vdb = 3 \times \text{inter-terminal distance}. \tag{Eq. 1}$$

By adjusting the distance between the drain terminal 1b and the gate control terminal 5 in this equation, the dielectric breakdown voltage Vdb is made smaller than the withstand voltage of the power semiconductor device 1. Thus, the surge voltage developed in the drain-source path of the power semiconductor device 1 is limited to the dielectric breakdown voltage and becomes lower than the withstand voltage of the power semiconductor device 1. As a result, it is possible to suppress the power semiconductor device 1 from breaking down by the surge voltage.

As described above, the gate control terminal 5 is provided at a position distanced from the drain terminal 1b by the predetermined distance in the power semiconductor device driving circuit 1, so that the discharge is generated between the drain terminal 1b and the gate control terminal 5 at the time of generation of surge. As a result of the discharge, the surge voltage is applied to the gate control terminal 5 and the gate of the power semiconductor device 1 is charged so that the power semiconductor device 1 is turned on to absorb the surge energy. It thus becomes possible to suppress the surge voltage applied to the drain terminal 1b. The power semiconductor device 1 can thus be protected from breaking down. As a result, the surge withstand voltage of the power semiconductor device 1 can be increased, the overvoltage applied to the drain terminal 1b can be suppressed and the protection from the overvoltage can be improved.

In addition, since this configuration adds only a small parasitic capacitor to the gate of the power semiconductor device 1, high speed switching performance is not lowered. It is thus possible to provide the power semiconductor device driving circuit 1, which can increase the withstand voltage of the power semiconductor device and protect the power semiconductor device from overvoltage without lowering the high speed switching performance.

According to the first embodiment, discharge occurs between the drain terminal 1b and the gate control terminal 5. It is therefore preferred that only the drain terminal 1b and the gate control terminal 5 are exposed at a position distanced from other devices thereby to eliminate influence on the other devices.

Second Embodiment

Figure 3:
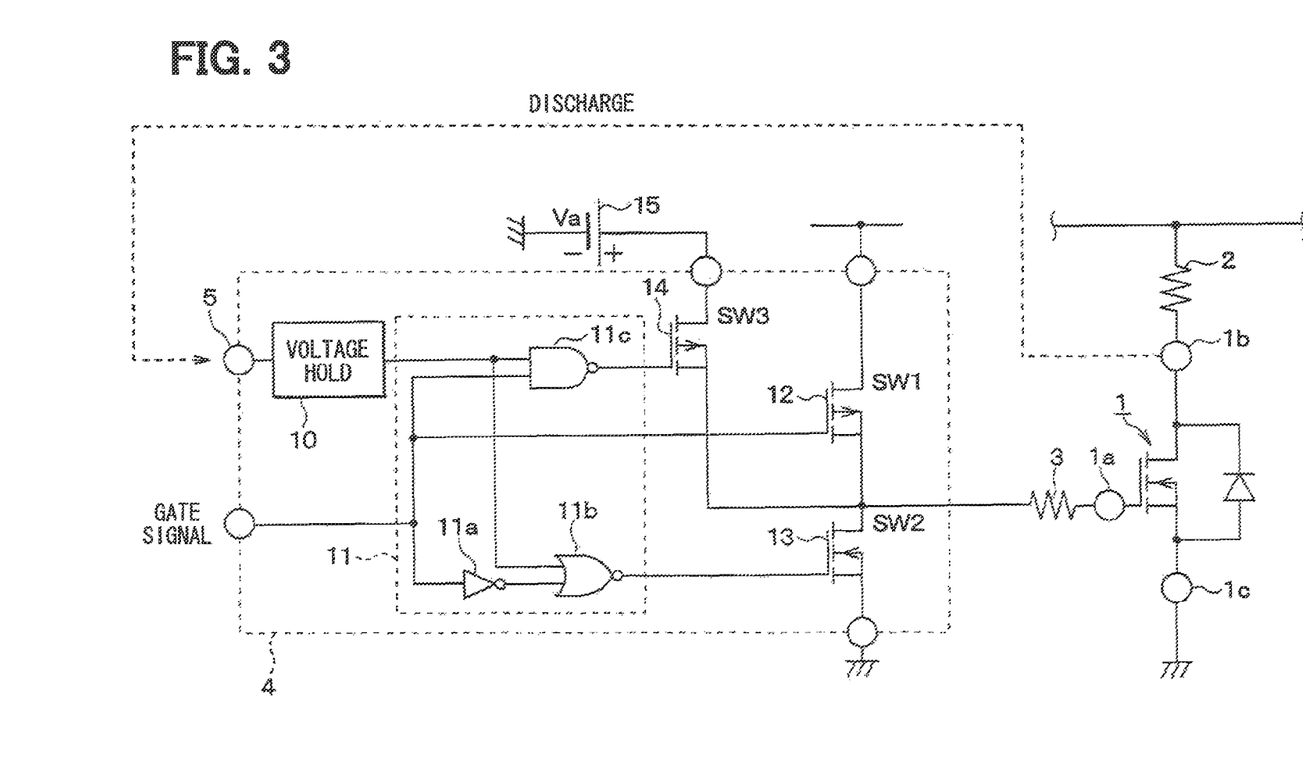
FIG. 3 is a circuit diagram showing a second embodiment of a power semiconductor device driving circuit.

A second embodiment of a power semiconductor device driving circuit is configured as shown in FIG. 3. The second embodiment is different from the first embodiment in that the position arrangement of the gate control terminal 5 and the configuration of the gate driving circuit 4 are changed. The second embodiment is the same as the first embodiment in respect to other parts and hence only the different parts will be described.

As shown in FIG. 3, the gate control terminal 5 is provided in the gate driving circuit 4, and a voltage holding circuit 10, a logic circuit 11 and three switches (SW) 12 to 14 are provided within the gate driving circuit 4. Further, an auxiliary power source 15 is connected to the gate driving circuit 4. The voltage holding circuit 10, the switch 13, the auxiliary power source 15 and the like form a gate charging circuit. The resistor 6 and the Zener diode 7 provided in the first embodiment are eliminated.

The voltage holding circuit 10 is configured to receive the voltage of the gate control terminal 5. When the discharge occurs between the drain terminal 1b and the gate control terminal 5 at the time of generation of surge, the surge voltage is applied. When the surge voltage is applied, the voltage holding circuit 10 outputs a high-level signal indicating the application of surge voltage for a predetermined period set longer than a period required to consume the surge energy. The circuit controls the gate terminal voltage of the power semiconductor device 1 to a voltage required to consume the surge energy as describe below. That is, the voltage holding circuit 10 uses the surge voltage applied to the gate control terminal 5 as a signal source, and controls the gate terminal voltage of the power semiconductor device 1 when the surge voltage is applied.

The logic circuit 11 is configured to turn on either one of the switches 12 to 14 at a desired timing based on the gate signal and the output of the voltage holding circuit 10. Specifically, the logic circuit 11 is configured to have a NOT circuit 11a, a NOR circuit 11b and a NAND circuit 11c. The NOT circuit 11e is for inputting an inverted gate signal to the second switch 13. The gate signal is inputted to the first switch 12 and the inverted gate signal, which is inverted by the NOT circuit 11a, is inputted to the NOR circuit 11b. The NOR circuit 11b is configured to turn on the second switch 13 by not only the gate signal (specifically the signal which is generated by inversion of the gate signal) but also the output of the voltage holding circuit 10. The NOR circuit 11c inputs the output of the NOT circuit 11a and the output of the voltage holding circuit 10 to control the second switch 13. The NAND circuit 11c controls the third switch 14 based on the gate signal and the output of the voltage holding circuit 10.

The first to the third switches 12 to 14 are switches, which control the gate terminal voltage of the power semiconductor device 1. The first and the second switches 12 and 13 are used as switches, which basically on/off-controls the power semiconductor device 1. Specifically, the gate terminal voltage is set to the power source voltage Vcc, when the first switch 12 is turned on and the second switch 13 is turned off. The gate terminal voltage is set to a GND potential, when the first switch 12 is turned off and the second switch 13 is turned on. The third switch 14 is used as a switch for controlling the gate terminal voltage of the power semiconductor device 1 to a surge energy absorbing voltage, which is close to the threshold voltage of the power semiconductor device 1. Specifically, this voltage is higher than the threshold voltage and lower than a voltage, by which the power semiconductor device 1 is fully turned on.

The auxiliary power source 15 generates an auxiliary power voltage Va, which corresponds to the surge energy absorbing voltage. The auxiliary power voltage Va is applied to the gate terminal 1a of the power semiconductor device 1 when the third switch 14 is turned on.

The operation of the second embodiment will be described below with reference to FIG. 4, which shows a basic operation of the second embodiment at the time of turn-off of the power semiconductor device 1. Since an operation of the second embodiment at the time of turn-on is the same as in the conventional circuit, only the basic operation at the time of turn-off is described.

At time T0, the first switch 12 and the second switch 13 are maintained in the on-state and the off-state based on the gate signal, respectively. As a result, the gate terminal voltage of the power semiconductor device 1 is the same as the power voltage. Vcc and the power semiconductor device 1 is in the on-state. At this time, since no voltage is applied to the gate control terminal 5, the output level of the voltage holding circuit 10 is low, the output level of the NAND circuit 11c is high, and the third switch 14 is in the off-state.

When the gate signal is changed from the low level to the high level at the time of turn-off as indicated at time T1, the first switch 12 is turned off, the second switch 13 is turned on. Since the gate terminal voltage becomes 0, the power semiconductor device 1 is turned off. At this turn-off time, the surge voltage is generated between the drain-source path of the power semiconductor device 1. When the voltage between the drain terminal 1b and the gate control terminal 5 reaches the dielectric breakdown voltage at time T2, the surge voltage is generated by the discharge and applied to the gate control terminal 5. This surge voltage is applied to the voltage holding circuit 10 and the output level of the voltage holding circuit is changed to and maintained at the high level during a predetermined period.

The output level of the NAND circuit 11c also changes to the low level. At time T30, which is after an elapse of a delay time of the logic circuit 11, the third switch 14 is turned on. The output level of the NOR circuit 11b becomes high and the second switch 13 is turned off. The auxiliary power voltage Va supplied by the auxiliary power source 15 is applied to the gate terminal 1a of the power semiconductor device 1 through the third switch 14, and the gate of the power transistor 1 is charged. As a result, the power semiconductor device 1 is turned on. The drain terminal voltage is decreased and during this period the surge energy is consumed by the on-resistance of the power semiconductor device 1.

At this time, the voltage applied to the terminal 1a of the power semiconductor device 1 is controlled to the auxiliary power voltage Va, which is close to the threshold voltage and lower than the voltage with which the power semiconductor device 1 is fully turned on. Thus, the power semiconductor device 1 has a smaller channel than in the full-on state. The narrowed channel has a larger resistance component and is in a limited-on state (for example, half-on state), in which the current flowing in the drain-source path is limited. It is therefore possible to more easily consume the surge energy than in a case that the power semiconductor device 1 is fully turned on. The surge energy can thus be consumed in a shorter period.

At time T40, which is after an elapse of a predetermined period required to consume the surge energy, the output level of the voltage holding circuit 10 returns to the low level, the output level of the NAND circuit 11c becomes low and the third switch 14 returns to the off state. Further the output level of the NOR circuit 11b becomes low, the second switch 14 is turned on and the voltage of the gate terminal 1a of the power semiconductor device 1 becomes 0. Thus the power semiconductor device 1 is turned off. It is thus possible to suppress the surge voltage applied to the drain terminal 1b when the power semiconductor device 1 is turned off.

As described above, according to the second embodiment, the gate driving circuit 4 is provided with the gate control terminal 5 and the voltage holding circuit 10 provided therein. Further, the power semiconductor device 1 is maintained in the on-state until the consumption of surge energy is finished. The second embodiment provides the similar advantage as the first embodiment.

Since the surge energy is absorbed by repetition of generation of discharge in the first embodiment, noise is likely to generate. According to the second embodiment, however, the repetition of generation of discharge is reduced and hence the noise can be suppressed.

Further, according to the second embodiment, the auxiliary power voltage Va is applied to the gate terminal is of the power semiconductor device 1 by the voltage holding circuit 10 during the period of consumption of the surge energy. That is, the power semiconductor device 1 is not fully turned on, but is in the limited turn-on state, in which the current flowing in the drain-source path is limited. It is thus possible to consume the surge energy in a shorter period in comparison to a case, in which the power semiconductor device 1 is fully turned on.

In a case that the first to the third switches 12 to 14 are controlled by the logic circuit 11, switching of the second switch 13 and the third switch 14 is delayed by a delay time generated in the logic circuit 11 from the change of the output level of the voltage holding circuit 10 to the high level. The surge voltage of the drain terminal 1b becomes higher than the dielectric breakdown voltage in correspondence to the delay period. However, the delay period is short and the surge voltage does not exceed the withstand voltage of the power semiconductor device 1. The power semiconductor device 1 is not therefore subjected to breakdown.

Third Embodiment

Figure 5:
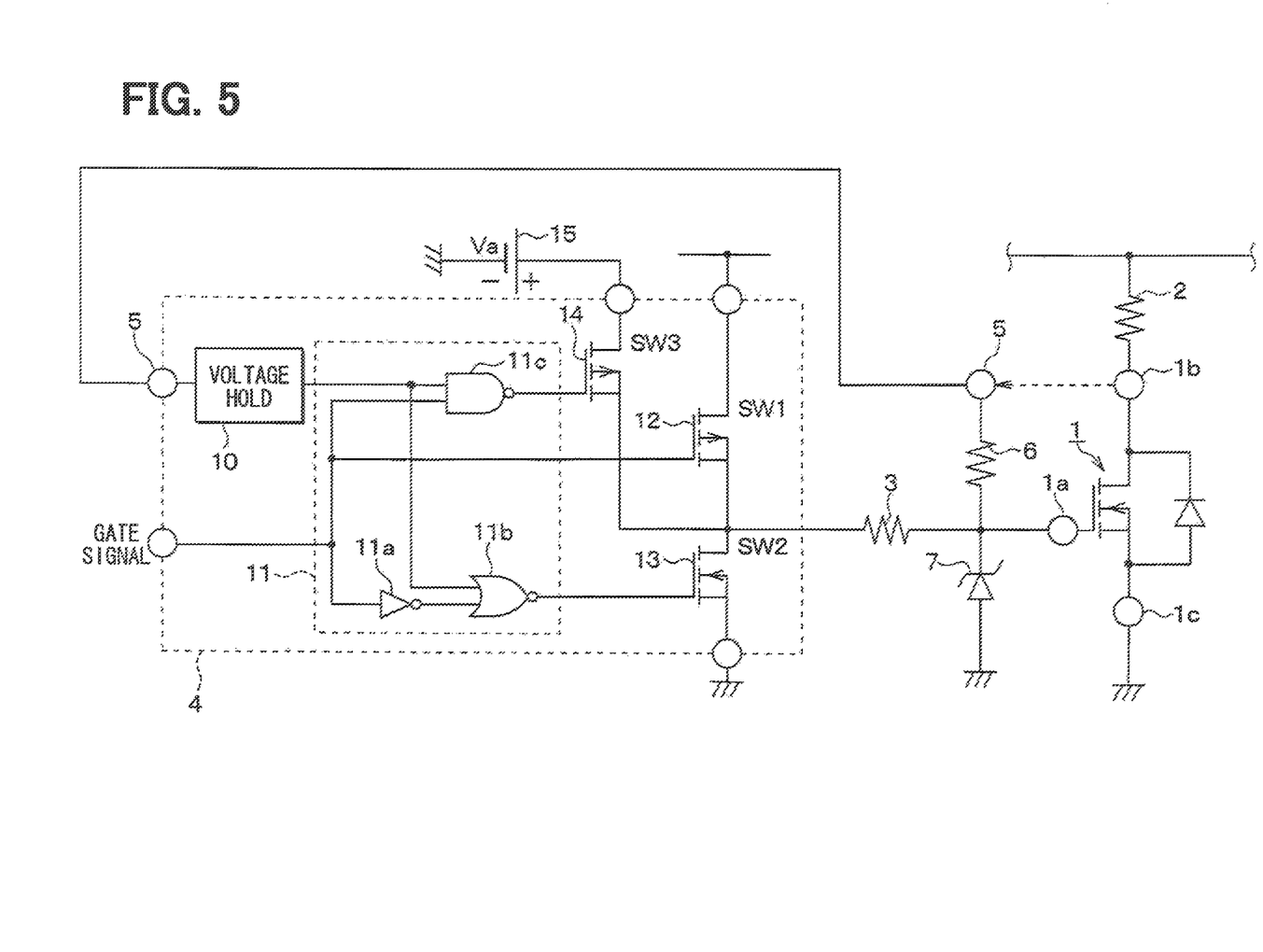
FIG. 5 is a circuit diagram showing a third embodiment of a power semiconductor device driving circuit.

A third embodiment of a power semiconductor device driving circuit is configured as shown in FIG. 5. The third embodiment is a combination of the first embodiment (FIG. 1) and the second embodiment (FIG. 3). Since the basic configuration is the same as the first and the second embodiments, only differences from the first and the second embodiments will be described.

As shown in FIG. 5, the gate control terminal 5 and the Zener diode 7 are provided in the same way as in the first embodiment. Further the gate control terminal 5 is provided also for the gate driving circuit 4. In addition, the voltage holding circuit 10, the logic circuit 11, the first to the third switches 12 to 14 and the auxiliary power source 15 are provided in the same way as in the second embodiment. Although the gate control terminal 5 connected to the resistor 6 and the gate control terminal 5 connected to the gate driving circuit 4 are shown as provided separately and connected by an electric conductor, these terminals 5 may be provided as a single terminal.

In the second embodiment, the gate terminal 1a of the power semiconductor device 1 can be controlled to the auxiliary power voltage Va, that is, closely to the threshold voltage, and the surge energy can be consumed in a short period. However, when the surge voltage is generated, the delay of the logic circuit 11 occurs.

However, by combining the first embodiment and the second embodiment, it becomes possible to charge the gate of the power semiconductor device 1 at high speeds according to the configuration of the first embodiment and to consume the surge energy at earlier time according to the configuration of the second embodiment.

Figure 6:
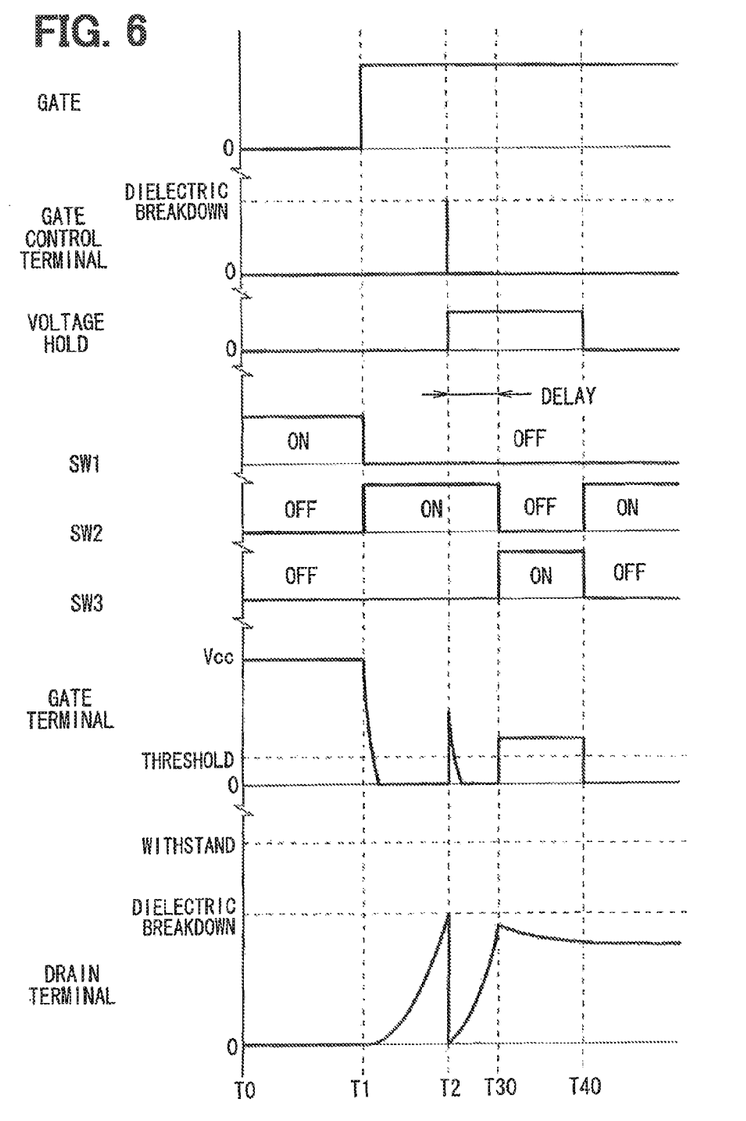
FIG. 6 is a time chart showing a basic operation of the third embodiment when a power semiconductor device is turned off.

A basic operation of the third embodiment at the time of turn-off will be described below.

At time T0, the first switch 12 and the second switch 13 are maintained in the on-state and the off state based on the gate signal, respectively. As a result, the gate terminal voltage of the power semiconductor device 1 is the same as the power voltage Vcc and the power semiconductor device 1 is in the on-state. At this time, since no voltage is applied to the gate control terminal 5, the output level of the voltage holding circuit 10 is low, the output level of the NAND circuit 11c is also low, and the third switch 14 is in the off-state.

When the gate signal is changed from the low level to the high level at the time of turn-off as indicated at time T1, the first switch 12 is turned off, the second switch 13 is turned on. Since the gate terminal voltage becomes 0, the power semiconductor device 1 is turned off. At this turn-off time, the surge voltage is generated in the drain-source path of the power semiconductor device 1. When the voltage between the drain terminal 1b and the gate control terminal 5 reaches the dielectric breakdown voltage at time T2, the discharge is generated and the surge voltage is applied to the gate control terminal 5. As a result, the power semiconductor device 1 is temporarily turned on and the drain terminal voltage is decreased. During this period, the surge energy is consumed by the on-resistance of the power semiconductor device 1.

When the surge voltage is applied to the gate control terminal 5, this voltage is also inputted to the voltage holding circuit 10 and the output level of the voltage holding circuit 10 is changed to the high level during this period.

For this reason, even when the drain terminal voltage rises because of the fall of the gate voltage to be lower than the threshold voltage, the delay time of the logic circuit 11 elapses during that period. The third switch 14 and the second switch 13 are turned on and off, respectively. The auxiliary power voltage Va generated by the auxiliary power source 15 is applied to the gate terminal 1a of the power semiconductor device 1, and the gate terminal voltage of the power transistor 1 is charged. As a result, the power semiconductor device 1 is turned on. The drain terminal voltage is decreased and the surge energy is consumed by the on-resistance of the power semiconductor device 1 in a short period. Then the third embodiment operates in the same manner as the second embodiment.

By combining the first embodiment and the second embodiment as described above, it becomes possible to charge the gate at high speeds according to the configuration of the first embodiment and to consume the surge energy at earlier time according to the configuration of the second embodiment. Although the noise problem arises in the first embodiment because the surge energy generated by the repetition of discharges is absorbed, such a noise problem can be minimized in the third embodiment because the number of times of discharging is reduced. Further it becomes possible to attain the surge voltage suppression before the elapse of the delay time of the logic circuit.

Fourth Embodiment

Figure 7:
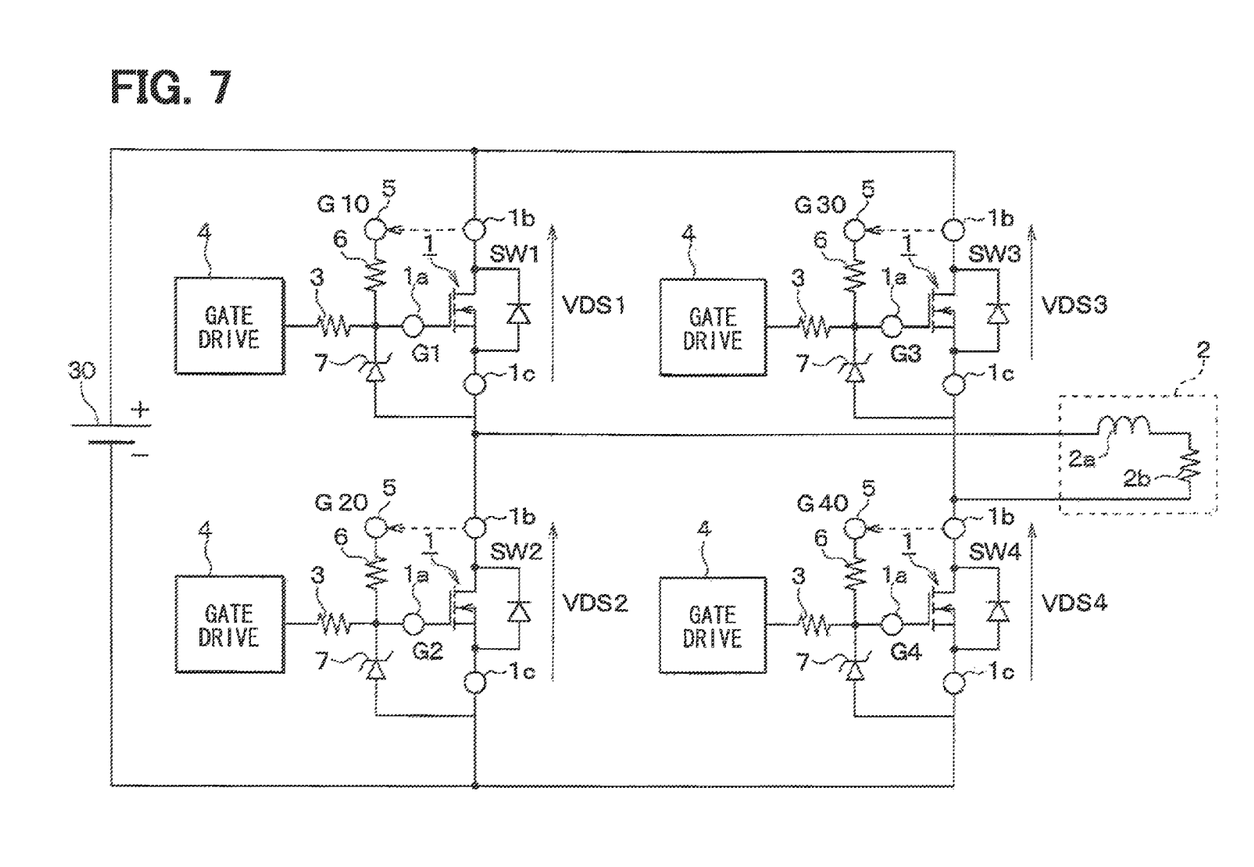
FIG. 7 is a circuit diagram showing an electric system including a full-bridge circuit, which uses a fourth embodiment of a power semiconductor device driving circuit.

A fourth embodiment of a power semiconductor device driving circuit is configured in the same way as the first embodiment and used for a full-bridge circuit of four arms as shown in FIG. 7. However, the second and the third embodiments may also be used similarly for the full-bridge circuit. This full-bridge circuit may be applied to an electric system, for example, a DC-DC converter, a PWM converter or the like.

In FIG. 7, four driving circuits, each of which forms an arm, are arranged in a full-bridge shape. That is, two circuits, each of which has two power semiconductor devices 1 connected in series between a positive side and a negative side of a DC power source 30, are provided. In this configuration, the load 2 is formed of an inductive component 2a and a resistive component 2b, and connected between junctions (neutral points) of the two power semiconductor devices 1 of each circuit. Thus the power semiconductor device driving circuit 1 can be exemplarily applied to the full-bridge circuit.

Figure 8:
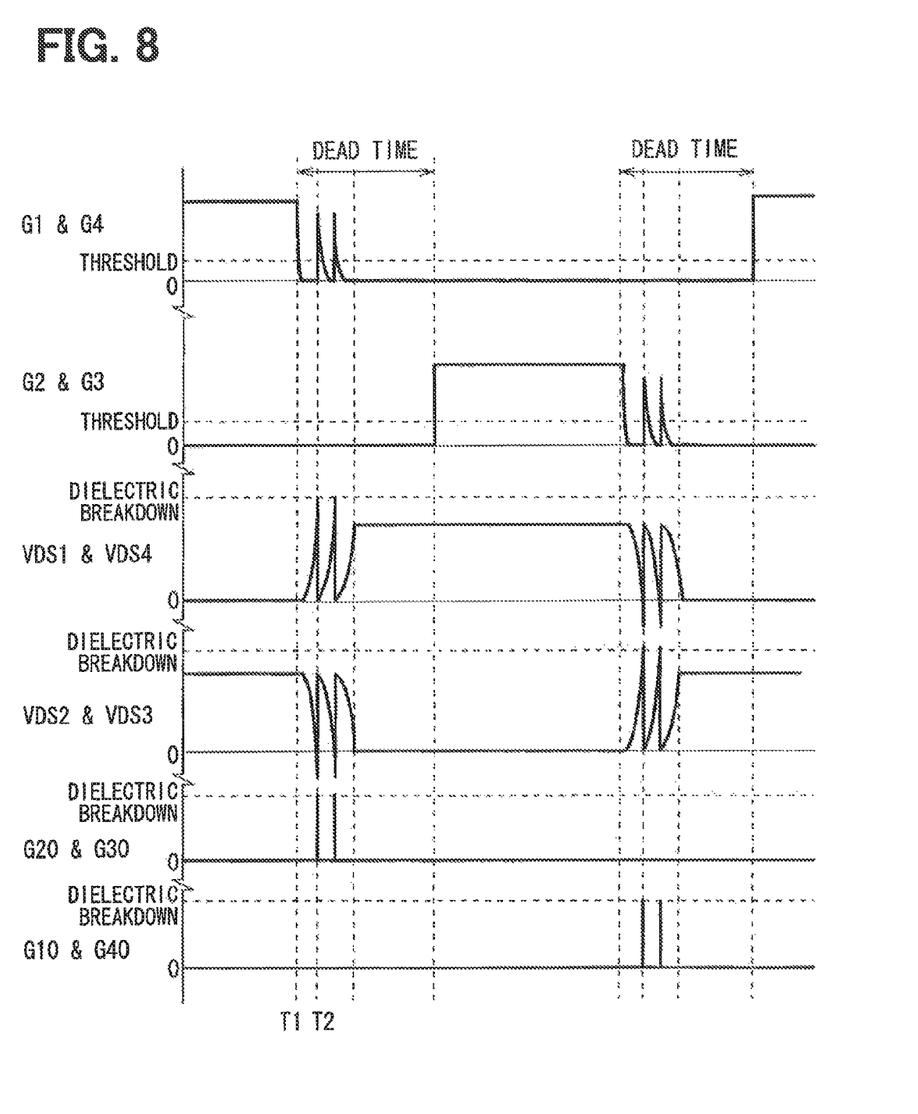
FIG. 8 is a time chart showing a basic operation of the fourth embodiment when a power semiconductor device is turned off.

A basic operation of the full-bridge circuit at the turn-off time is shown in FIG. 7. Since the operation of the fourth embodiment at the turn-on time is the same as the conventional circuit, only the basic operation at the turn-off time will be described. As shown in FIG. 7, in one of the two circuits each having two series-connected power semiconductor devices 1, a high-side power semiconductor device 1, its drain-source path voltage, a low-side power semiconductor device 1 and its drain-source path voltage are designated as SW1, VDS1, SW2 and VDS2, respectively. Further, in the other of the two circuits each having two series-connected power semiconductor devices 1, a high-side power semiconductor device 1, its drain-source path voltage, a low-side power semiconductor device 1 and its drain-source path voltage are designated as SW3, VDS3, SW4 and VDS4, respectively. The gate terminals 1a of the power semiconductor devices SW1 to SW4 are designated as G1 to G4, respectively. Similarly, the gate control terminals 5 of the same are designated as G10 to G40.

In the bridge circuit, the power semiconductor devices SW1 and SW4 operate synchronously so that a current flows through the power semiconductor devices SW1 and SW4 through the load 2 at the same time and the power semiconductor devices SW2 and SW3 operate synchronously so that a current flows through the power semiconductor devices SW2 and SW3 through the load 2 at the same time. The pair of the power semiconductor devices SW1, SW4 and the pair of the power semiconductor devices SW2, SW3 turn on and off alternately to generate an AC voltage for the load 2. A dead time is provided so that both of the pairs turn off at the same time to prevent power supply short-circuit.

After the power semiconductor devices SW1 and SW4 are turned off, the drain terminal voltages Vd (VDS1 and VDS4) of the power semiconductor devices SW1 and SW4 reach the dielectric breakdown voltage relative to the gate control terminals G10 and G40. As a result, voltages are generated at the gate control terminals G10 and G40 by the discharge. The generated voltages are applied to the gates of the power semiconductor devices SW1 and SW4 through respective resistors 6 to charge the gates. The power semiconductor devices SW1 and SW4 turn on and the drain terminal voltages of the power semiconductor devices SW1 and SW4 are lowered. During this period, the surge energy is consumed by the power semiconductor devices SW1 and SW4. This operation is repeated until the surge energy disappears. The surge voltages developed at the drain terminal voltages Vd (VDS1, VDS4) of the power semiconductor devices SW1 and SW4 are suppressed.

Since it is during the dead time period that the power devices SW1 and SW4 turn on repeatedly, the pair of power semiconductor devices SW1, SW4 and the pair of power semiconductor devices SW2, SW3 do not turn on at the same and hence the power supply short-circuit is not caused. When the power semiconductor devices SW2 and SW3 turn off, the power semiconductor devices SW2 and SW3 operate in the same way as the power semiconductor devices SW1 and SW4. As a result, the surge energy can be consumed and the surge voltages generated at the drain terminal voltages (VDS2, VDS4) of the power semiconductor devices SW2 and SW3 can be suppressed.

Fifth Embodiment

Figure 9:
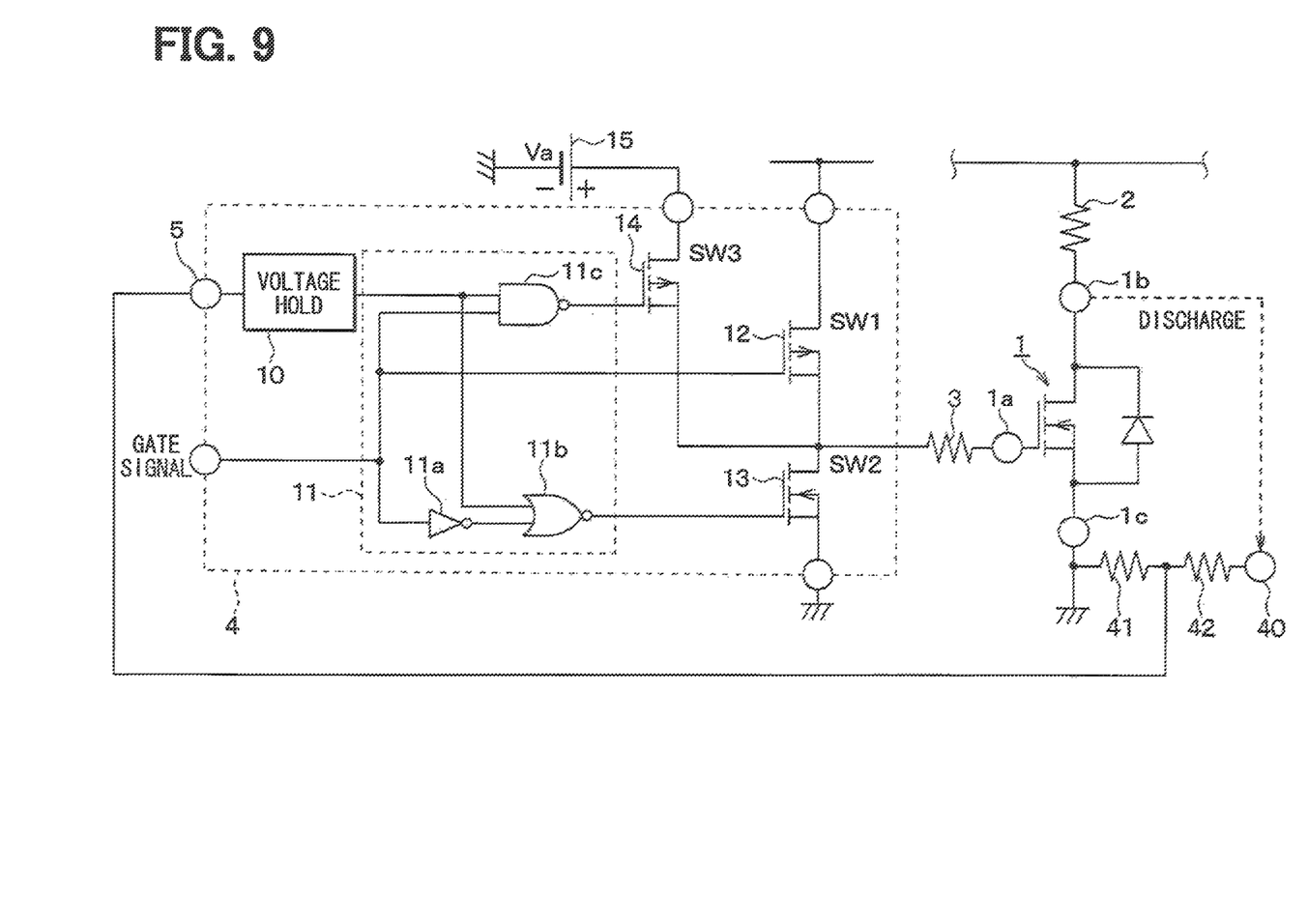
FIG. 9 is a circuit diagram showing a fifth embodiment of a power semiconductor device driving circuit.

A fifth embodiment of a power semiconductor device driving circuit is configured as shown in FIG. 9. The fifth embodiment is different from the second embodiment in respect of a section, at which the discharge is generated, but is the same as the second embodiment in other respects. Therefore, only the difference from the second embodiment will be described.

As shown in FIG. 9, the gate control terminal 5 is provided in the gate driving circuit 4. Further, the voltage holding circuit 10, the logic circuit 11, three switches 12 to 14 and the auxiliary power source 15 are provided in the gate driving circuit 4. The resistor 6 and the Zener diode 7 provided in the first embodiment are not provided.

According to the fifth embodiment, a source connection terminal 40, which is connected as a connection terminal to the source terminal 1c is used as a discharge terminal so that the discharge is generated between the drain terminal 1b and the source connection terminal 40. Voltage dividing resistors 41 and 42 are provided between the source terminal 1c and the source connection terminal 40. A junction between the voltage dividing resistors 41 and 42 is connected to the gate control terminal 5 provided in the gate driving circuit 4.

Figure 10:
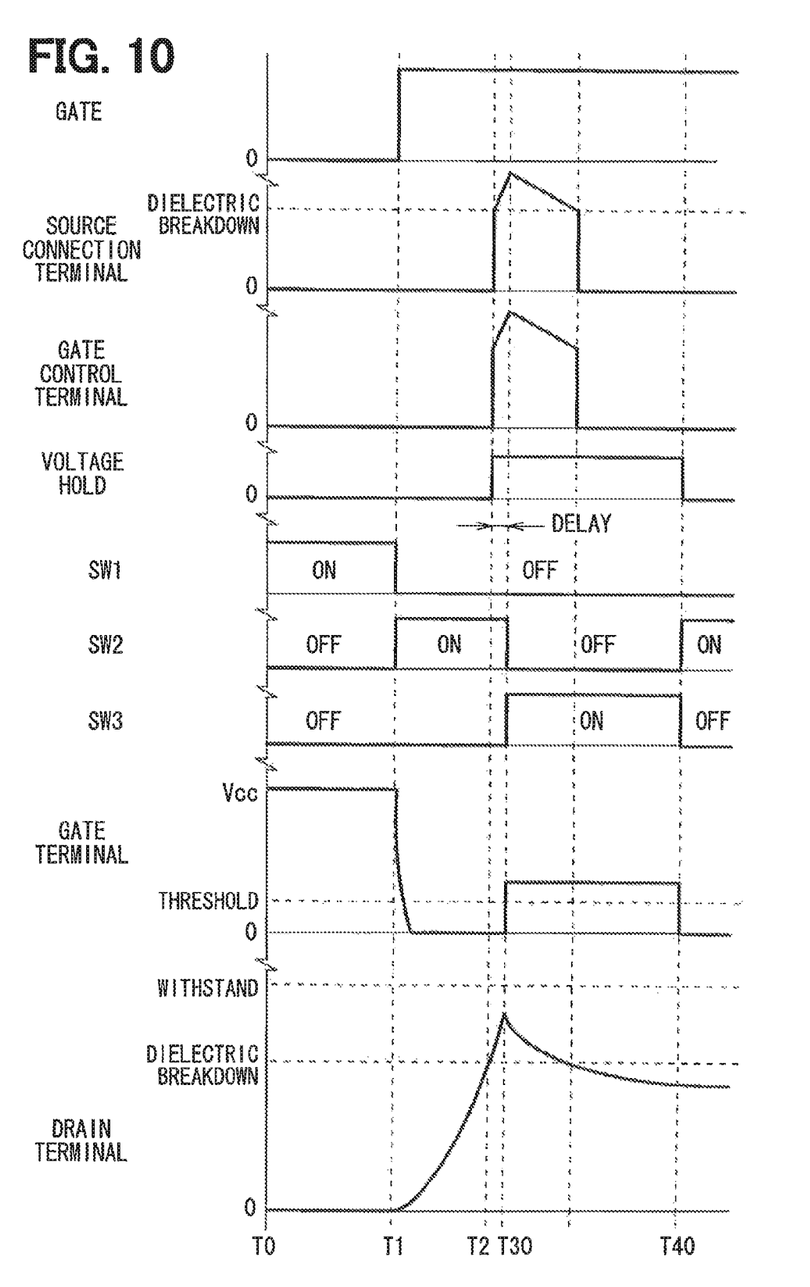
FIG. 10 is a time chart showing a basic operation of the fifth embodiment when a power semiconductor device is turned off.

A basic operation of the fifth embodiment at the turn-off time is shown in FIG. 10. Since the operation of at the turn-on time is the same as the conventional circuit, only the basic operation at the turn-off time will be described.

Figure 4:
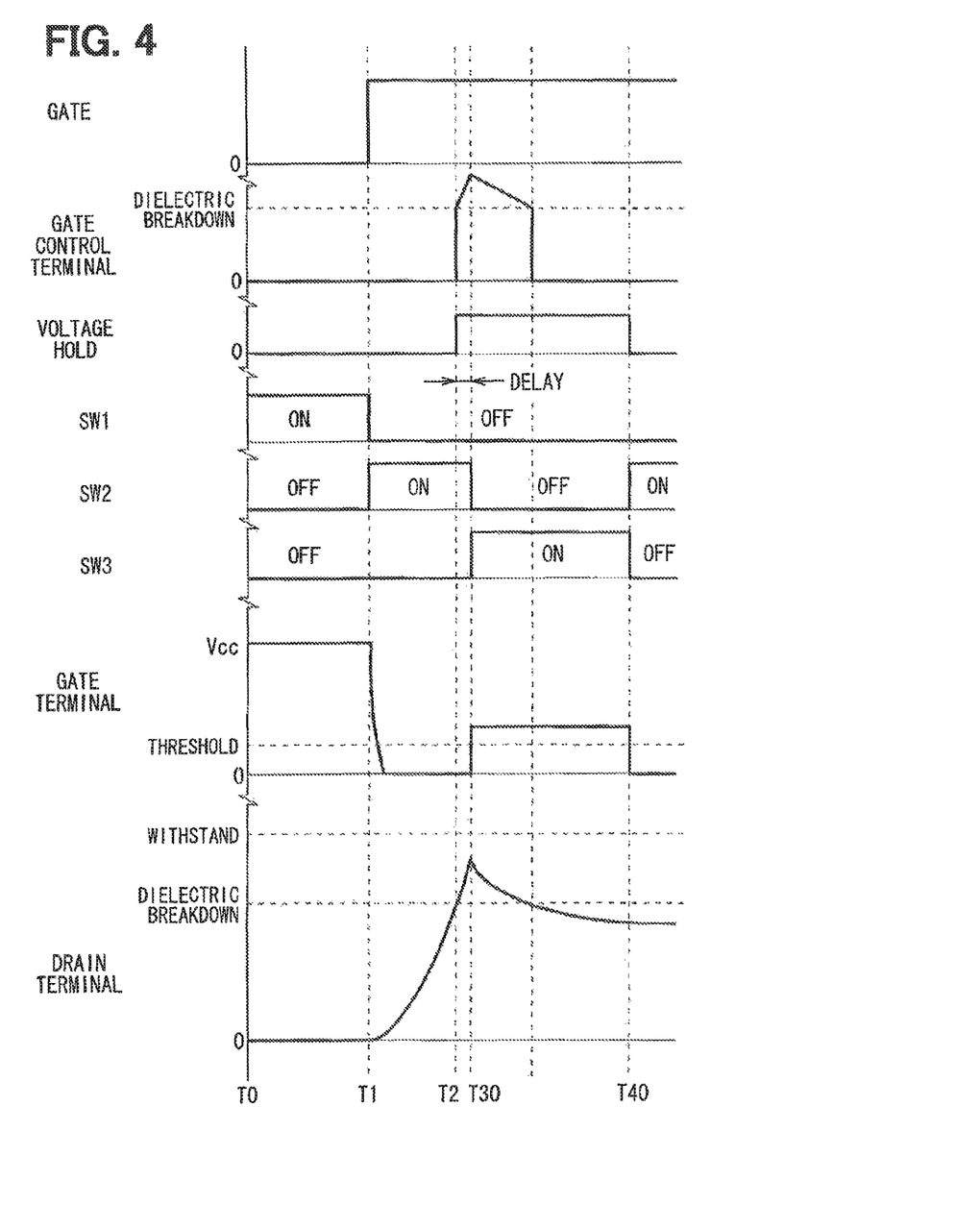
FIG. 4 is a time chart showing a basic operation of the second embodiment when a power semiconductor device is turned off.

At time T0, the same condition is maintained as in the case of the second embodiment shown at time T0 in FIG. 4. When the gate signal is changed from the low level to the high level at the turn-off time at time T1 from the above-described condition, the first switch 12 and the second switch 13 are turned off and on, respectively. Since the gate terminal voltage is reduced to 0, the power semiconductor device 1 is turned off. At this turn-off time, the surge voltage is generated in the drain-source path of the power semiconductor device 1.

When the voltage reaches the dielectric breakdown voltage between the drain terminal 1b and the source connection terminal 40 at time T2, the discharge occurs and applies the surge voltage to the source connection terminal 40. This voltage is divided by the voltage dividing resistors. 41 and 42 and applied to the voltage holding circuit 10 through the gate control terminal 5. The output of the voltage holding circuit 10 is switched over to the high level during a predetermined period.

Thus, the same operation is performed as shown after time T1 in FIG. 4 so that the power semiconductor device 1 is turned on and the drain terminal voltage is lowered. During this period, the surge energy is consumed by the on-resistance of the power semiconductor device 1. Since the auxiliary power voltage Va is used as the voltage, which is applied to the gate terminal 1a of the power semiconductor device 1, it becomes possible to more easily consume the surge energy than in a case of fully turning on the power semiconductor device 1.

The same advantage is provided as in the second embodiment by thus suppressing the surge voltage of the drain terminal 1b and absorbing the surge energy based on the discharge between the drain terminal 1b and the source connection terminal 40.

Other Embodiments

In each of the first to the fifth embodiments, the power semiconductor device 1 is formed of a MOSFET. However, the power semiconductor device 1 may be formed of other semiconductor switching devices such as an IGBT, thyristor or GTO (gate turn-off thyristor). In case of the IGBT, however, sections representing the first terminal 1b and the second terminal 1c are changed so that the first terminal 1b and the second terminal 1c are set to a collector terminal and an emitter terminal.

Although the full-bridge circuit is exemplified as an example of application of the driving circuit in the fourth embodiment, the driving circuit may be applied to a half-bridge circuit or a three-phase bridge circuit.

What is claimed is:

1. A power semiconductor device driving circuit comprising:
   a power semiconductor device formed of a semiconductor switching device, which controls a current supplied to a first terminal and a second terminal based on a gate voltage applied to a gate terminal, the first terminal and the second terminal being a high-side terminal and a low-side terminal;
   a gate driving circuit for controlling the gate voltage applied to the gate terminal of the power semiconductor device;
   a discharge terminal provided at a position separated from the first terminal by a predetermined distance and electrically insulated from the first terminal to cause a discharge between the first terminal and the discharge terminal when the voltage at the first terminal rises by generation of a surge and reaches a dielectric breakdown voltage;
   an auxiliary power source for supplying an auxiliary power voltage close to the threshold voltage of the power semiconductor device but smaller than a voltage required to fully turn on the power device, wherein the auxiliary power source is powered separately from the surge in providing the auxiliary power voltage; and
   a gate charge circuit, which turns on the power semiconductor device by charging a gate terminal of the power semiconductor device based on the discharge between the first terminal and the discharge terminal and lowers the voltage of the first terminal by a current flowing between the first terminal and the second terminal, wherein
   the discharge terminal includes a gate control terminal provided in the gate driving circuit; and
   the gate charging circuit includes a voltage holding circuit, which is provided in the gate driving circuit and turns on the power semiconductor device by holding the gate terminal in a state that the auxiliary power source is coupled to the gate terminal to couple the auxiliary power voltage to the gate terminal for a predetermined period when the surge voltage is applied to the gate control terminal.

2. The power semiconductor device driving circuit according to claim 1, wherein:
   the discharge terminal further includes another gate control terminal provided outside the gate driving circuit;
   the gate charge circuit includes a resistor provided between the another gate control terminal and the gate terminal of the power semiconductor device; and
   the gate of the power semiconductor device is charged by the surge voltage, which is generated by the surge, applied to the another gate control terminal and applied to the gate terminal through the resistor.

3. The power semiconductor device driving circuit according to claim 1, further comprising:
   wherein the gate charging circuit includes a switch, which is turned on during the predetermined period by the voltage holding circuit, and
   the gate charging circuit applies the auxiliary power voltage supplied by the auxiliary power source to the gate terminal when the switch is turned on.

4. The power semiconductor device driving circuit according to claim 1, wherein:
   the power semiconductor device is a MOSFET, and
   the first terminal and the second terminal are a drain terminal and source terminal, respectively.

5. The power semiconductor device driving circuit according to claim 4, further comprising:
   a load connected to the drain terminal.

6. The power semiconductor device driving circuit according to claim 4, further comprising:
   a Zener diode connected between the gate terminal and a reference potential point that is at the same potential at the source terminal, wherein
   the Zener diode limits a gate-source voltage to not exceed the Zener voltage.

7. The power semiconductor device driving circuit according to claim 1, wherein:
   a space between the first terminal and the discharge terminal is in a gaseous condition so that the dielectric breakdown occurs at the dielectric breakdown voltage, which varies with the predetermined distance and a type of gas filling the space between the first terminal and the discharge terminal, and
   the dielectric breakdown voltages is directly proportional to the predetermined distance by a factor of 3.

* * * * *